(12) United States Patent
Sharma

(10) Patent No.: US 7,741,142 B2
(45) Date of Patent: Jun. 22, 2010

(54) METHOD OF FABRICATING A BIOSENSOR

(75) Inventor: Manish Sharma, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1213 days.

(21) Appl. No.: 11/286,065

(22) Filed: Nov. 22, 2005

(65) Prior Publication Data

US 2007/0117243 A1    May 24, 2007

(51) Int. Cl.
*H01L 21/4763*   (2006.01)

(52) U.S. Cl. .................... 438/49; 438/701; 204/403.01; 257/E21.495

(58) Field of Classification Search ............ 438/43, 438/49, 701, 713, 942, 943; 257/253, 254, 257/415, 623, E23.179, E21.238, E2.495; 204/403.01; 435/287.2
See application file for complete search history.

(56) References Cited

U.S. PATENT DOCUMENTS

| | | | |
|---|---|---|---|
| 4,956,149 A * | 9/1990 | Kawana et al. ............. | 422/68.1 |
| 4,977,105 A * | 12/1990 | Okamoto et al. ............ | 438/639 |
| 6,471,838 B1 * | 10/2002 | Igel et al. ................ | 204/403.01 |
| 6,811,663 B1 * | 11/2004 | Freeman et al. ............. | 204/400 |
| 7,073,246 B2 * | 7/2006 | Bhullar et al. ................ | 29/595 |
| 2003/0017424 A1 * | 1/2003 | Park et al. ................... | 430/322 |
| 2004/0248282 A1 * | 12/2004 | Sobha M. et al. ......... | 435/287.2 |
| 2005/0023137 A1 * | 2/2005 | Bhullar et al. ........... | 204/403.1 |
| 2008/0135408 A1 * | 6/2008 | Sjolander ............... | 204/403.01 |

* cited by examiner

*Primary Examiner*—Matthew C Laudau
*Assistant Examiner*—Daren Wolverton

(57) ABSTRACT

The present invention provides a method of fabricating a biosensor. The method includes providing a substrate which has a surface coating. The surface coating is deformable and the substrate includes a layered structure which has at least two electrically conductive layers separated by at least one electrically insulating layer. The method also includes imprinting a structure into the surface coating. Further, the method includes etching at least a region of the imprinted structure and the substrate to remove at least a portion of the structure and the substrate. The structure is shaped so that the etching forms at least a portion of the biosensor in the substrate and exposes at least a portion of each electrically conductive layer to form electrodes of the biosensor.

13 Claims, 3 Drawing Sheets

METHOD OF FABRICATING A BIOSENSOR

FIELD OF THE INVENTION

The present invention relates generally to a method of fabricating a biosensor.

BACKGROUND OF THE INVENTION

Biosensors are used to obtain information about molecules that can be used to identify the molecules. The molecules may be suspended in a solution or may be present in gaseous form and attach either directly or indirectly to electrodes of the biosensor.

For example, detection of nucleic acids often involves hybridisation to DNA that is in contact with electrodes of the biosensor. Other types of molecules may directly attach to the electrodes of the biosensor. The attached molecules influence electrical properties of the biosensor which can be detected by impedance or capacitance measurements at the electrodes.

Fabrication of biosensors typically involves many processing steps. The biosensor may include a series of electrodes which are closely spaced from each other by a distance of 100 nm or less. Fabrication of such a bio-sensor typically involves a sequence of masking and etching steps similar to those used for the fabrication of integrated electronic devices. The biosensor typically includes portions having a molecular dimension which makes fabrication of the biosensor especially difficult. Further, the fabrication of the electrodes at well defined positions which are separated only by a distance in the nanometer range typically involves complicated aligning processing steps. There is a need for technological advancement that simplifies the fabrication of such biosensors.

SUMMARY OF THE INVENTION

Briefly, an embodiment of the present invention provides a method of fabricating a biosensor. The method includes providing a substrate which has a surface coating. The surface coating is deformable and the substrate includes a layered structure which has at least two electrically conductive layers separated by at least one electrically insulating layer. The method also includes imprinting a structure into the surface coating. Further, the method includes etching at least a region of the imprinted structure and the substrate to remove at least a portion of the structure and the substrate. The structure is shaped so that the etching forms at least a portion of the biosensor in the substrate and exposes at least a portion of each electrically conductive layer to form electrodes of the biosensor.

The invention will be more fully understood from the following description of an embodiment of the invention. The description is provided with reference to the accompanying drawings.

DETAILED DESCRIPTION OF EMBODIMENTS

Figure 1:
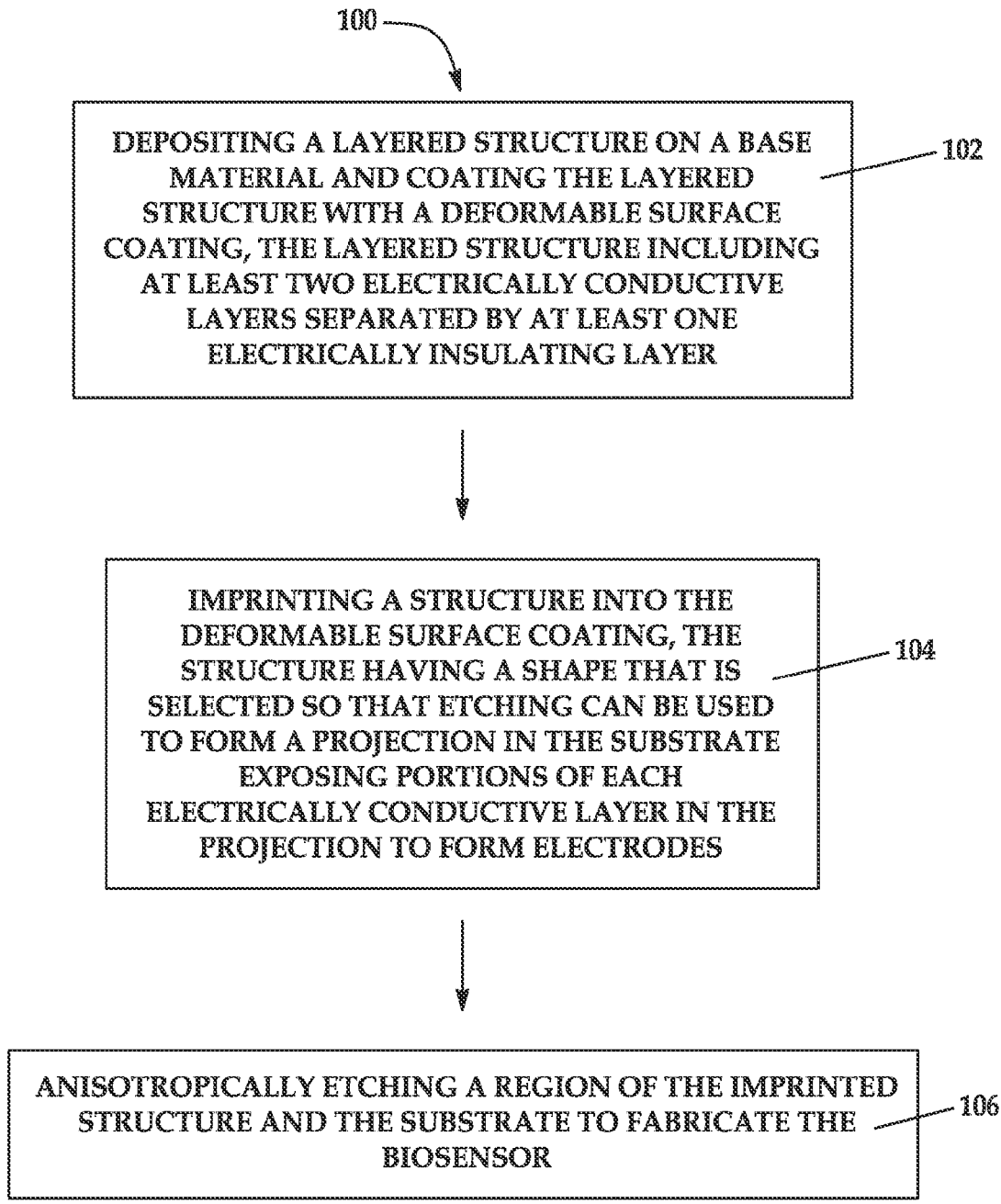
FIG. 1 is a flow chart illustrating a method of fabricating a biosensor according to an embodiment of the present invention.
Figure 2:
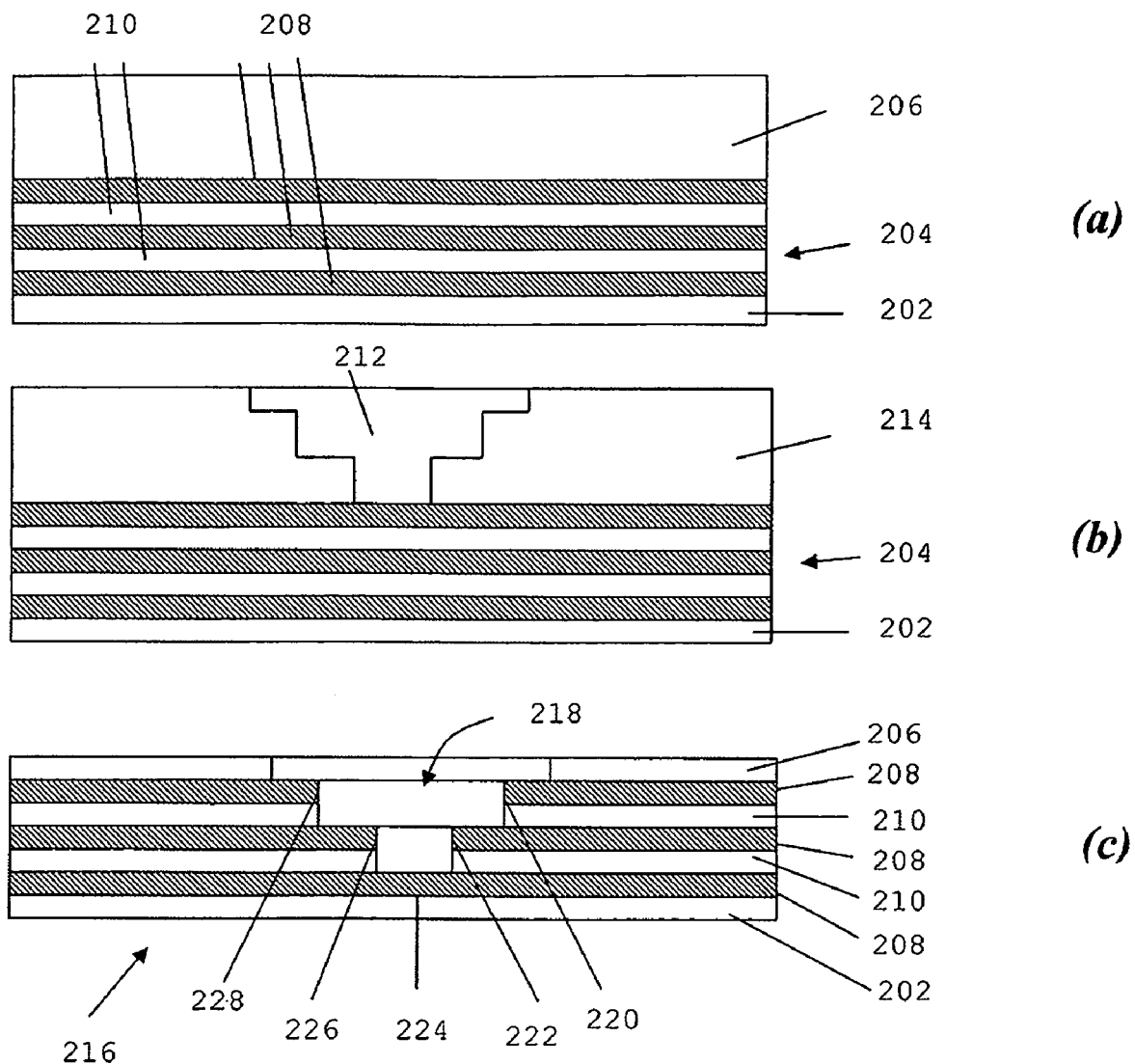
FIGS. 2(a) to 2(c) show cross-sectional representations of a biosensor at different fabrication stages according to an embodiment of the present invention.

Referring initially to FIGS. 1 and 2, a method of fabricating a biosensor according to an embodiment is now described. The method 100 includes step 102 of depositing a layered structure on a base material and coating the layered structure with a deformable surface coating. The layered structure includes at least two electrically conductive layers separated by at least one electrically insulating layer. Throughout this specification the term "electrically conductive layer(s)" is used for layer(s) that are electrically conductive or electrically semi-conductive. For example, these layer(s) may include metallic, a doped polymeric or semi-conductive material such as silicon-based semi-conductive material or any other suitable semi-conductive material.

FIG. 2(a) shows an example of such a layered structure 204 positioned on a base material 202 and coated with a deformable surface coating 206. The deformable surface coating 206 may include a polymeric material that is curable using UV radiation. The deformable surface coating 206 typically is single layered, but may also include a plurality of layers. The base material 202 may be formed from a hard material but typically is formed from a flexible material such as a polymeric material.

In order to improve clarity, the illustrated layered structure 204 includes only three electrically conductive layers 208 and two electrically insulating layers 210. It is to be appreciated that typically the layered structure includes more than three electrically conductive layers and more than two electrically insulating layers. For example, the layered structure may include a relatively large number of the electrically conductive layers, such as more than 10 or more than 100 electrically conductive layers, separated by electrically insulating layers. The electrically conductive layers 208 may for example be formed from a metallic material such as gold or copper or any other suitable conductive material including metal-doped conducting polymers. The electrically insulating layers 210 are composed of silica but may also be composed of other suitable insulating materials. The electrically conductive layers 210 may also be replaced by semi-conductive layers such as layers formed from doped silicon. The layers 208 and 210 have a thickness of approximately 10 nm, but in variations of this embodiment the layers may also have other thicknesses such as less than 200 nm or may be as thin as less than 5 nm.

Figure 3:
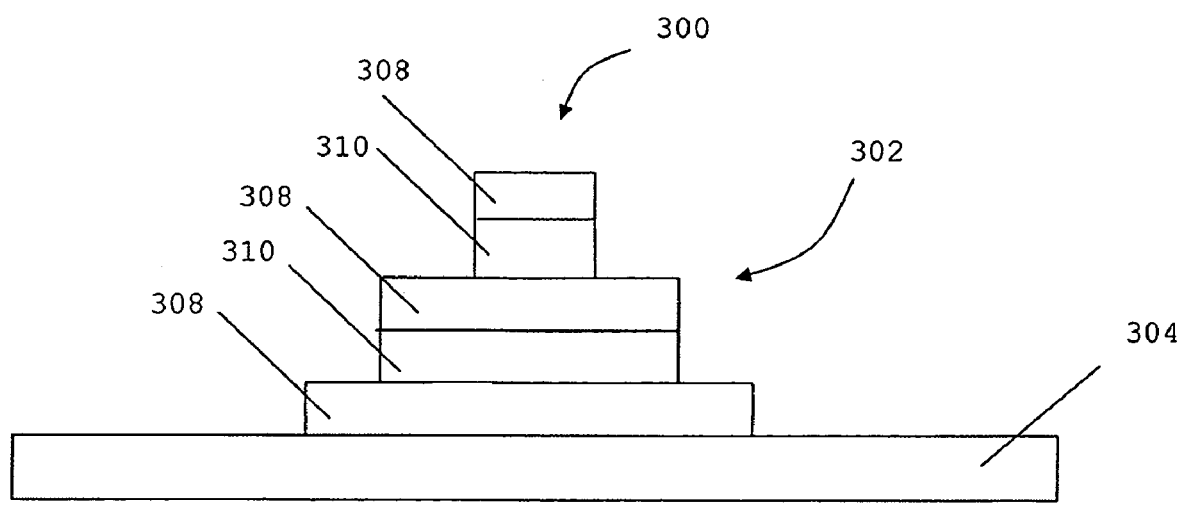
FIG. 3 shows a cross-sectional representation of a biosensor according to another embodiment of the present invention.

Step 104 imprints a structure into the deformable surface coating. The structure has a shape that is selected so that etching, such as an anisotropic etching process, forms a well in the layered structure. The shape is also selected so that the etching exposes at least a portion of each electrically conductive layer to form electrodes of the biosensor. In a variation of this embodiment the structure may have a shape that is selected so that the etching forms any other type of suitable recess in the layered structure such as a channel. Further, the structure may be shaped so that the etching forms a projection that contains the electrodes. A biosensor including such a projection is shown in FIG. 3 and will be discussed below.

In the embodiment illustrated in FIG. 2 the layers 208 and 210 have a thickness of approximately 10 nm. The structure is shaped and the layer thicknesses are selected so that the etching forms electrodes that are separated by a distance of 10-20 nm. The layers typically have thicknesses and the structure typically is shaped so that the separations between adjacent electrodes are less than 100 nm and may also be as small as 5 nm or less.

FIG. 2(b) shows a stamp 212 which imprints a structure 214 into the deformable surface coating 206. After the imprinting the stamp 212 is removed leaving the structure 214 exposed. The structure 214 is then cured using UV radiation.

Step 106 uses an anisotropic etch process to etch the imprinted structure and a region of the layered structure which removes the imprinted structure and a portion of the layered structure 204. For example, the anisotropic etching may be conducted using a directional physical etching processes such as ion beam etching (also referred to as ion milling) or anisotropic reactive ion etching (RIE). It is to be appreciated, however, that alternatively any other suitable etching process may be used which may not necessarily be anisotropic. For example, a chemical etching process may be used. Many chemical etching processes are known and the person skilled in the art will appreciate that the suitability of a particular chemical etching process depends on the material of the layered structure and dimensions and shape of the biosensor that is formed in the layered structure. Further, multiple etching processes may be combined into a sequence of etching steps to achieve different etching rates and sidewall profiles of the layers.

In a variation of this embodiment the shape of the structure may be selected so that only a portion of the biosensor is formed in the layered structure. In this case the etching typically does not remove the entire imprinted structure but a portion of the imprinted structure remains and forms a part of the biosensor such as a rim of the well.

FIG. 2(c) shows the formed biosensor 216. The structure 214 has been etched away and a recess 218 has been formed in the layered structure 204. In this embodiment the recess 218 has the shape of a well and has electrodes 220, 222, 224, 226 and 228 which can be contacted through the respective electrically conductive layers to perform current, voltage, impedance or capacitance measurements.

In use the well typically is filled with a solution containing molecules to be tested or identified. The molecules may adsorb, either directly or indirectly via an adsorbing agent, and may link two electrodes. From electrical measurements at the linked electrodes and from the separation of the linked electrodes information about the molecules can be derived which can be used to test and/or identify the molecules. More than one detection technique may be combined. For example, an electrical potential or a current may be measured between the electrodes, and the effect on the orientation or movement of the molecules may be observed by optical means which may detect scattering of light, or spectral changes of absorbed or reflected light.

The method 100 has the advantage that a biosensor having closely spaced electrodes at well defined locations can be fabricated in a simplified manner. The combination of imprinting a structure into a deformable material and the subsequent etching make it possible to fabricate a biosensor having such closely spaced and separated electrodes without separate processing steps in which the layers that form electrodes are aligned relative to each other.

FIG. 3 shows a representation of a biosensor according to another embodiment. The biosensor 300 includes a projection 302 that is formed from a layered structure positioned on base material 304. The layered structure has electrically conductive layers 308 separated by insulating layers 310. Exposed ends of the electrically conductive layers form electrodes for adsorption of molecules. The biosensor was formed using a method that is closely related to the method 100 described above, the only difference being that the structure that was imprinted into the deformable material was shaped so that the etching forms the projection 302 in the layered structure and not a well. All other processing steps and the materials are the same as those described above in the context of the method 100. For example, the projection may be elongated along a plane defined by the base material 304 and the electrically conductive layers 308 may in use be connected at ends of the projection 302 to electrical devices for electrical measurements.

Although the embodiments have been described with reference to particular examples, it is to be appreciated by those skilled in the art that the embodiments may take other forms. For example, the biosensor may include any number of electrodes. In addition, it is to be appreciated that only one specific design of the biosensor has been described and various other designs may be fabricated in variations of the method 100. Further, the biosensor may not necessarily be arranged to detect molecules in a solution, but may be arranged to detect molecules in a gaseous environment.

What is claimed is:

1. A method of fabricating a biosensor, the method comprising:
providing a substrate with a surface coating, the surface coating being deformable and the substrate comprising a layered structure, the layered structure comprising at least two electrically conductive layers separated by at least one electrically insulating layer;
imprinting a structure into the surface coating; and
etching at least a region of the imprinted structure and the substrate to remove at least a portion of the structure and the substrate to form a projection;
wherein the structure is shaped so that the etching forms at least a portion of the biosensor in the substrate and exposes at least a portion of each electrically conductive layer to form electrodes of the biosensor.

2. The method of claim 1 wherein:
the structure is shaped so that the etching exposes at least one of the electrically conductive layers.

3. The method of claim 1 wherein:
the layered structure comprises more than two electrically conductive layers, the electrically conductive layers being separated by electrically insulating layers and spaced apart by a distance that is selected so that etching exposes at least a portion of each electrically conductive layer to form electrodes that are disposed at a predetermined distance from each other.

4. The method of claim 3 wherein:
the layered structure comprises more than 10 electrically conductive layers separated by electrically insulating layers and the etching exposes at least a portion of each electrically conductive layer.

5. The method of claim 3 wherein:
the thickness of the layers of the layered structure is selected so that the etching exposes at least a portion of each electrically conductive layer to form electrodes and adjacent electrodes are separated by a distance of less than 100 nm from each other.

6. The method of claim 5 wherein:
the adjacent electrodes are separated by a distance of less than 10 nm.

7. The method of claim 5 wherein:
the adjacent electrodes are separated by a distance of less than 5 nm.

8. The method of claim 1 wherein:
providing the substrate comprises forming the layered structure on a base material and coating an exposed layer with the deformable material.

9. The method of claim 8 wherein:
the base material is a flexible material.

10. The method of claim 8 wherein:
the base material comprises a polymeric material.

11. The method of claim 8 wherein:
the deformable surface coating comprises a polymeric material.

12. The method of claim 8 wherein:
the shape of the structure is selected so that the etching forms the biosensor in the substrate and the etching removes the entire imprinted structure.

13. The method of claim 8 wherein:
the shape of the imprinted structure is selected so that the etching forms a portion of the biosensor in the substrate and the etching removes a portion of the imprinted structure.

* * * * *